(12) United States Patent
Xia (10) Patent No.: US 7,323,962 B2
(45) Date of Patent: Jan. 29, 2008

(54) MAGNET AND METHOD OF FORMING UNIFORM MAGNETIC FIELD FOR MRI SYSTEM

(75) Inventor: Pingchou Xia, Beijing (CN)

(73) Assignee: Beijing Taijie Magneto-Electric Institute, Beijing (CN)

( * ) Notice: Subject to any disclaimer, the term of this patent is extended or adjusted under 35 U.S.C. 154(b) by 226 days.

(21) Appl. No.: 10/947,350

(22) Filed: Sep. 23, 2004

(65) Prior Publication Data

US 2005/0258924 A1    Nov. 24, 2005

(30) Foreign Application Priority Data

May 18, 2004   (CN)   ........................ 2004 1 0009099

(51) Int. Cl.
*H01F 3/00*   (2006.01)
(52) U.S. Cl. .................................................... 335/296
(58) Field of Classification Search ......... 335/296–299
See application file for complete search history.

(56) References Cited

U.S. PATENT DOCUMENTS

| | | | | |
|---|---|---|---|---|
| 4,672,346 A | * | 6/1987 | Miyamoto et al. | .......... 335/296 |
| 4,679,022 A | * | 7/1987 | Miyamoto et al. | .......... 335/296 |
| 4,777,464 A | * | 10/1988 | Takabatashi et al. | ........ 335/306 |
| 4,937,545 A | * | 6/1990 | Chaillout et al. | ........... 335/298 |
| 6,922,055 B1 | * | 7/2005 | Damadian et al. | .......... 324/318 |
| 6,975,117 B1 | * | 12/2005 | Damadian et al. | .......... 324/319 |

* cited by examiner

*Primary Examiner*—Elvin Enad
*Assistant Examiner*—Bernard Rojas
(74) *Attorney, Agent, or Firm*—Rothwell, Figg, Ernst & Manbeck, PC

(57) ABSTRACT

The present invention relates to the magnetic apparatus for magnetic resonance imaging system and method for forming uniform magnetic field. The magnetic apparatus comprises a field yoke for forming flux path, a first member of permanent magnet, provided on one end of the field yoke, free end of which is inclined inwardly, a second member of permanent magnet, provided on the other end of the field yoke in symmetry with the first member of permanent magnet, having reverse polarity with the first member of permanent magnet, an adjusting block, provided on the center of the field yoke for extruding magnetic field formed by the first and second members of permanent magnet. The adjusting block in the present invention can form a magnetic field for adjusting to extrude the basic magnetic field in order to provide a parallel magnetic field. The present invention can be applied in the MRI system and make the system have a high open degree for operations. The MRI system can be made compact, movable and inexpensive.

23 Claims, 7 Drawing Sheets

FIG. 12 ns.MAGNET AND METHOD OF FORMING UNIFORM MAGNETIC FIELD FOR MRI SYSTEM

FIELD OF THE INVENTION

The present invention relates to a permanent magnet for a Magnetic Resonance Imaging (MRI) system, and particularly to a permanent magnet for imaging in a sheet of sensitive field for an MRI system and a method of forming uniform magnetic field in a sheet.

BACKGROUND OF THE INVENTION

The conventional Magnetic Resonance Imaging (MRI) scanner cannot be applied in interventional therapy to the extent that the magnet surrounds the patient and the access to the patient is obstructed; meanwhile, a highly uniform magnetic field is required within a sphere of 30~50 cm diameter and the patient can pass in and out the sphere freely in the conventional MRI scanner, which leads to a large and heavy magnet. A compact and movable MRI system cannot be made.

The above-mentioned two disadvantages of the conventional MRI scanner result from the conventional imaging method. According to the method, the positions of the patient to be examined (sample for short) such as head, thoracic cavity and abdominal cavity etc., must be first entirely placed in a highly uniform magnetic field (the inhomogeneity is within the order of $10^{-5}$), which is generally a sphere of 30~50 cm diameter. Then, by adding the slice selection gradient field, the different tissue slices of the positions to be examined which are entirely in the highly uniform magnetic field, along the direction of the gradient field, are respectively controlled by the magnetic fields of different magnetic intensity. According to the Nuclear Magnetic Resonance Theory, with the radio frequency (RF) field of different temporal frequency, the human body tissue slices can be excited respectively at this time; that is, with the radio frequency (RF) field at the Larmor frequency of the nucleus to be examined corresponding to the magnetic intensity of the set objective slice to be excited, all the spins in the selected objective slice are excited. This progress is called imaging slice selection by the gradient field, or slice selection for short. The slice to be excited is called an objective slice. After the objective slice is excited and the operations to the gradient coils, radio frequency source and spectrometer by the suitable pulse sequence are completed, the magnetic resonance information of the excited slice is obtained. Finally, the magnetic resonance images are obtained by dealing with the information. Repeating all the steps above by changing the frequency of the radio frequency (RF), another selected slice is excited, and the images are obtained following the same steps as the above-mentioned. After all of the images for the set objective slices of the tissues to be examined are obtained, the examination is finished.

The precondition of such imaging method is to require a highly uniform magnetic field in a sphere of 30~50 cm diameter with the inhomogeneity no more than $10^{-5}$ order. To this end, the volume of interest should be in the center of the magnet which surrounds the whole body of the patient. Thus, the magnet is large and heavy and interventional therapy is impossible. A compact and movable MRI system cannot be made.

Figure 1:
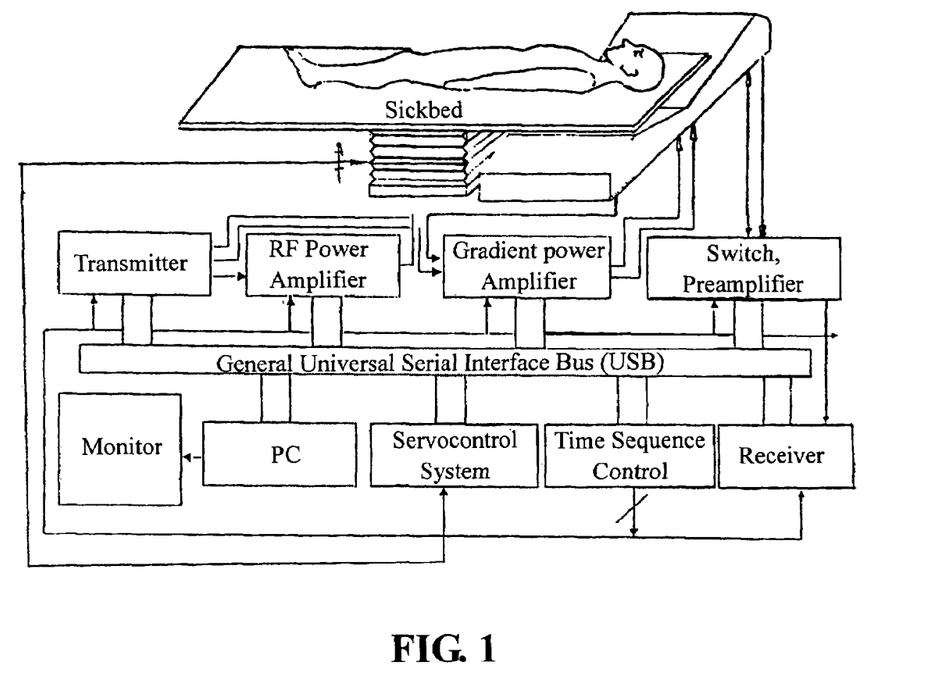
FIG. 1 is a schematic view of an open MRI system according to the prior art.

An imaging method for MRI was presented by the applicant on the basis of a highly open magnet design (referring to the CN patent No. 1371000A). As shown in FIG. 1, the method includes: (1) constructing a volume of interest with a uniform magnetic field in a sheet outside the magnet; (2) moving the objective slice of the tissue to be examined to the position overlapping with the sheet of interest by a servo-control system; (3) exciting the objective slice with an RF field produced by an RF coil; (4) encoding the spins in the sheet with the gradient field along two orthogonal directions except for the slice thickness direction produced by gradient coils; (5) receiving the signal of the objective slice and reconstructing the image; (6) making another objective slice overlap with the sheet of interest by servocontrol system; (7) repeating the steps from (3) to (6) to obtain the image of another objective slice; (8) repeating steps from (6) to (7) until all the objective slice images are obtained.

Figure 2:
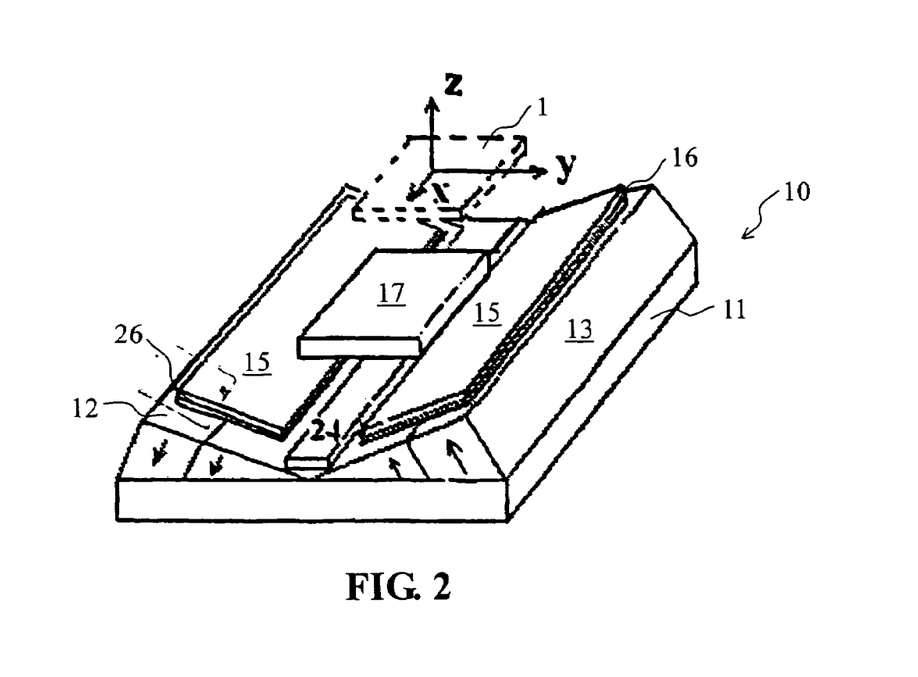
FIG. 2 is a perspective view of the magnet apparatus in the system of FIG. 1.

A method of fabricating the magnet system is also provided in the disclosure of the prior art. According to the method, a uniform magnetic field in a sheet outside the magnet is obtained and the gradient field along two orthogonal directions except for slice thickness direction is produced in the volume of interest. Referring to FIG. 2, the magnet 10 consists of field yoke 11, the first magnetic stack 12, the second magnetic stack 13, the first gradient coil 15 and the second gradient coil 16. The two magnetic stacks 12/13 are placed on the field yoke 11 symmetrically relative to the field yoke 11. There is an angle between the surfaces of the two magnetic stacks 12/13 facing to the bed. A ferric plate 17 for adjusting the field is placed between the two magnetic stacks 12/13, which can change the distribution of the magnetic field in the area 1 of interest and make the uniformity of the magnetic field meet the requirement. The first gradient coil 15 and the second gradient coil 16 are superposed on the surfaces of the two magnetic stacks 12/13 facing to the bed, respectively.

Furthermore, for the first and second magnetic stacks 12/13, the angle θ between the surfaces facing to the bed is preferably between 0 and 180 degrees. The magnetic stacks are made from many kinds of permanent magnetic materials overlapped in layers, such as permanent magnetic ferrite, alnico, samarium cobalt alloy, sintered NdFeB, forming a wedge form. One side surface of the wedge is attached to the magnetic yoke and another facing to the volume of interest. The magnetization direction of the magnetic material is along the direction from one surface of the wedge to another.

Furthermore, for the first and second magnetic stacks 12/13 made of single magnetic material, the angle between the surfaces facing to the bed is preferably zero. The shape of these two magnetic stacks is strip.

Furthermore, the shape of the ferric plate 17 for adjusting the field is strip shaped. Its cross section is any one of the following shapes: square, rectangle, trapezoid, half circle and circle. The ferric plate 17 is fixed on the joint between the first and second magnetic stacks 12/13 with glue joint or mechanical bonding. If these two magnetic stacks are separated, the slab is fixed on the yoke between these two magnetic stacks.

Furthermore, the first and second gradient coils 15/16 in the magnet system which produce linear gradient field along two orthogonal directions in the volume of interest except for the slice thickness direction are fixed on the surface of the first and second magnetic stacks 12/13 facing to the bed. These two gradient coils with the same shape and number of turns could be overlapped on the magnetic stacks.

Furthermore, in this full open MRI scanner, the bed is made from non-conductive and non-ferromagnetic materials and placed under the volume of interest. The surface of the bed is parallel to the plane of the sheet of interest and lower than it. The altitude of the bed can be adjusted by the servocontrol system manipulating the lift stand on the back of the bed.

According to this technique, the volume of interest is on the one side of the magnet, which permits full access to the patient. This kind of MRI system can be applied in the interventional therapy. In this invention, the volume of interest is not a large sphere but a sheet outside of the magnet, which makes the magnet light and small. The MRI system can be made compact and movable.

In the above-mentioned full open magnetic resonance imaging apparatus, two symmetrical magnetic stacks and a ferric plate for adjusting the field are adopted to form a uniform and parallel magnetic field for the first time. But, the formation and the adjusting method for the magnet are theoretical and not concrete, thus it affects the application of the above-mentioned MRI system.

SUMMARY OF THE INVENTION

It is an object of the present invention to provide a magnet for an MRI scanner, which can produce a uniform sheet of interest by improving the cooperation between the permanent magnets and the field yokes and using an adjusting block of two layers. In the volume of interest, magnetic induction intensity B has the identical direction and the inhomogeneity of its modulus is within the order of no more than $10^{-4}$-$10^{-5}$ which can meet the requirement of MRI.

The present invention provides a magnet for an MRI system, comprising a field yoke for forming a flux path; a first member of permanent magnet, provided on one end of the field yoke, free end of which is inclined inwardly; a second member of permanent magnet, provided on the other end of the field yoke in symmetry with the first member of permanent magnet, having reverse polarity with the first member of permanent magnet; an adjusting block, provided on the center of the field yoke for extruding magnetic field formed by the first and second members of permanent magnet. The adjusting block is divided into two parts to be symmetrical to each other, each of which has identical polarity with the first/second member of permanent magnet to be adjacent. Each part of the adjusting block comprises a slab of permanent magnet, a magnetic conductor provided on the field yoke for supporting the slab of permanent magnet.

The free end of each member of permanent magnet comprises a first end face and a second end face perpendicular to the first end face. The width of the first end face is larger than that of the second end face. Furthermore, an angle between the first/second member of permanent magnet and the field yoke is about 25°~55°; an angle between the magnetization direction and an axial of each member of permanent magnet is about −20°~20°. Preferably, each member of permanent magnet is divided into several subsections, each of which is individually magnetized, and an angle between a magnetization direction and an axial of the first/second member of permanent magnet for each subsection increases from the fixed end to the free end.

The member of permanent magnet comprises a base; side parts, coupled to the base respectively, the maximum magnetic energy level of which is larger than that of the base. The length of the base is about 2~6 times of that of the side part.

For the application, the distance between the free ends of the first and second members of permanent magnet is about 400 mm, and the distance between the free end and the adjusting block is about 200 mm.

The present invention also discloses a method for forming a uniform magnetic field in a magnetic resonance imaging system, comprising the step of forming a field yoke for forming a flux loop; forming a first member of permanent magnet, provided on one end of the field yoke, a free end of which is inclined inwardly; forming a second member of permanent magnet, provided on the other end of the field yoke in symmetry with the first member of permanent magnet, having reverse polarity with the first member of permanent magnet; forming an adjusting block, provided on the center of the field yoke for extruding a magnetic field formed by the first and second members of permanent magnet.

The present invention has the following advantages:

The magnet is light and has a high degree of openness because a large uniform magnetic field volume is not required (generally a sphere with a 30~50 cm diameter). Thus, the magnet provided in this invention is especially useful for an MRI system for operations and makes the MRI system very cheap and moveable.

A new imaging method is presented in this invention. Slice selection is canceled and the objective slice in the examined tissue is directly placed in a sheet of interest rather than a sphere to obtain the images directly.

The servocontrol system is included in the MRI system for moving the bed and making the different objective slices of the tissue overlap with the sheet of interest.

More importantly, in the MRI system according to the present invention, a uniform sheet of interest is obtained in which the inhomogeneity of the magnetic field is below the order of $10^{-4}$-$10^{-5}$, and the requirement of MRI is met. The magnet is light and has a high degree of openness because a large uniform field volume is not required (generally a sphere with a 30~50 cm diameter) in this magnet apparatus. Thus, the magnet of this invention is especially useful for an MRI system for operations and makes it very cheap and moveable.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 3:
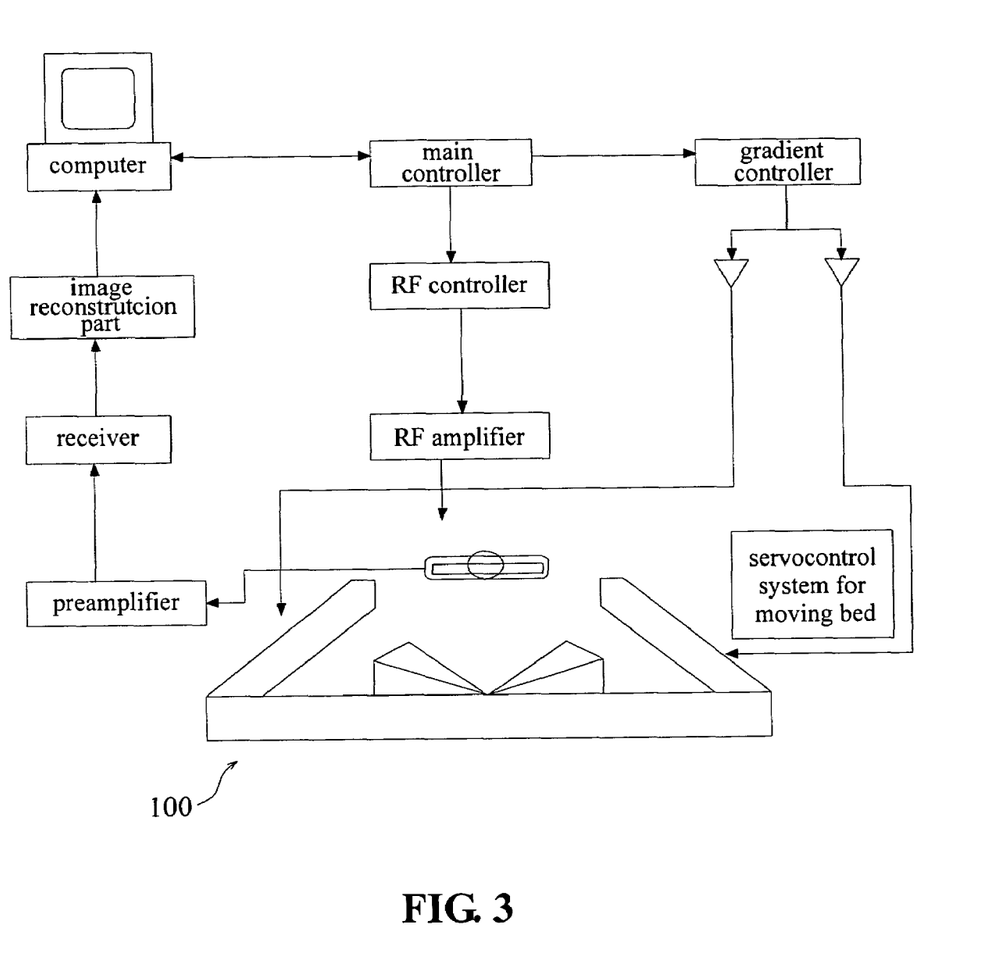
FIG. 3 is a schematic view of an open MRI system of the present invention.

As shown in FIG. 3 which is a schematic view of the open MRI system of the present invention, the MRI system comprises a magnet 100 (comprising magnet and gradient coils), a servocontrol system for moving a bed, a main controller, an RF controller, an RF amplifier, RF coils, a gradient controller, a preamplifier, a receiver, an image reconstruction part, and a computer. Except for the magnet, all other parts published before will not be described here.

Figure 4A:
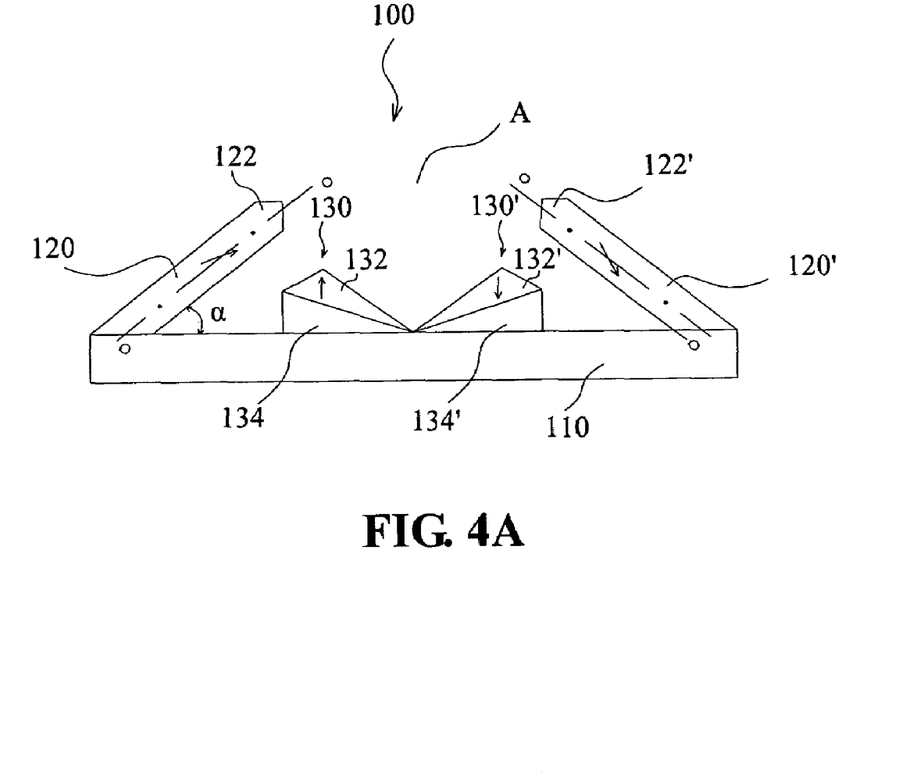
FIG. 4A is a schematic view of the magnet according to a preferred embodiment of the present invention.

In order to acquire a uniform magnetic field in a sheet, the base field is produced by three parts which is extruded by an adjusting field produced by a group of adjusting parts. As shown in FIG. 4A, the magnet 100 of one preferred embodiment of the invention comprises a field yoke 110 for forming a flux path, a first member of permanent magnet 120 and a second member of permanent magnet 120', a first adjusting block 130 and a second adjusting block 130'. The first and second members of permanent magnet 120/120 are respectively provided on the two ends of the field yoke 110 in symmetry relative to the central line of the field yoke 110, the free ends 122/122' of which having reverse polarity are inclined inwardly and are separated from each other to form an open area A. The first and second adjusting blocks 130/130' are symmetrically provided on the field yoke 110 and between the two free ends 122/122.

Specially, the adjusting block of the present invention is of double layers. Each of the adjusting blocks 130/130' consist of a slab of permanent magnet 132/132', a magnetic conductor 134/134' which is provided on the field yoke 110. The magnetic conductor 134/134' can support the slab of permanent magnet 132/132' and help to form the flux loop to adjust the field in the open area A.

To extrude the magnetic field in the open area A, according to the fundamental property that identical poles always repel and opposite poles always attract, the first part of adjusting block 130 and the first member of permanent magnet 120, the second part of adjusting block 130' and the second member of permanent magnet 120' respectively have the identical polarity. In the preferred embodiment shown in FIG. 4A, the shape of the two parts of adjusting block 130/130' which are symmetric relative to the normal line of the field yoke 110 is that of a wedge. In the preferred embodiment shown in FIG. 4B, the shape of the two parts of adjusting block 232/232' is cuboids. According to the present invention, the angle a between the field yoke 110 and the two members of permanent magnet 120/120' is within the range from 25 to 55 degrees. Preferably, the angle α is about 44 degrees.

Figure 5:
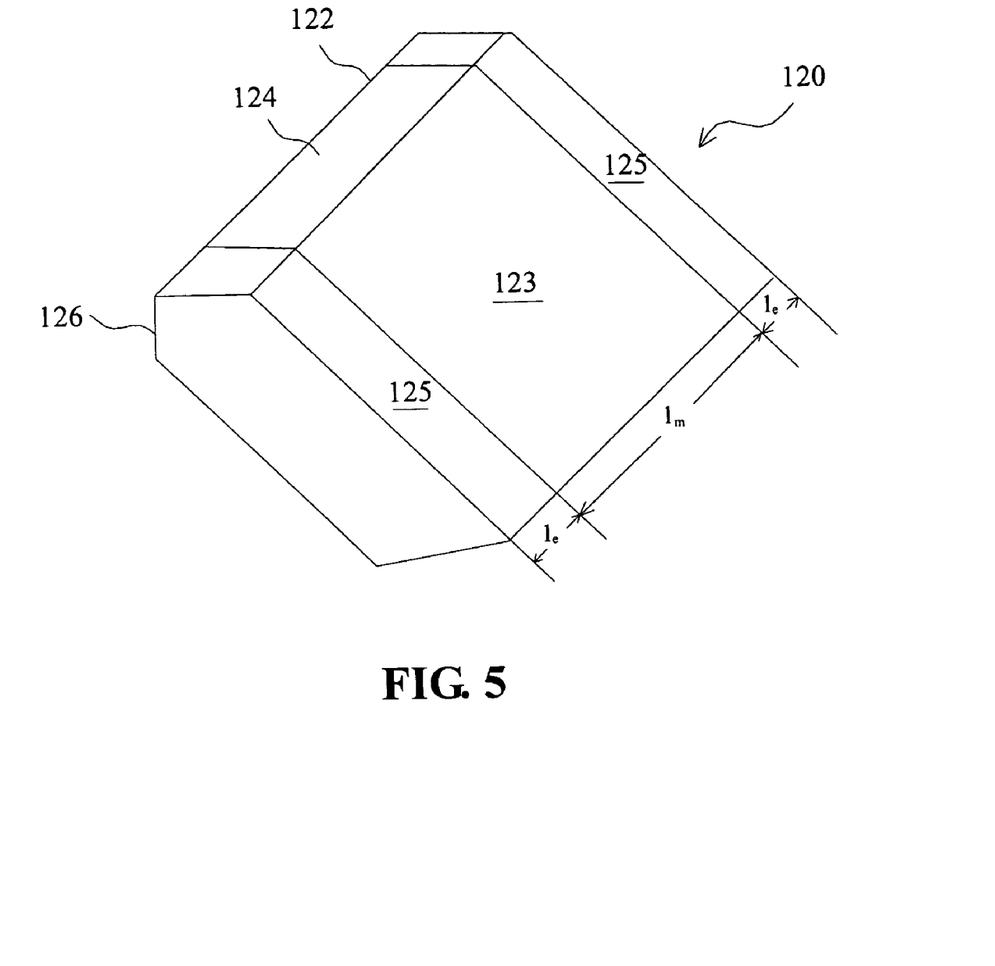
FIG. 5 is a perspective view of the members of permanent magnet of the present invention.

The detailed description of the members of permanent magnet is given below referring to the first member of permanent magnet 120. As shown in FIG. 5, the first member of permanent magnet 120 along the length direction comprises a base 123, two side parts 125 which are coupled to the base respectively. Because the magnetic field of the side parts 125 could be weakened by the leakage of magnetism, the side parts 125 are made from materials of permanent magnet with maximum energy level $BH_{max}$ higher than that of the base 123. Preferably, the length of the base 123 is 2~6 times of that of the side parts 125. Furthermore, the free end 122 consists of a first end face 124 and a second end face 126. The second end face 126 is almost perpendicular to the first end face 124, so that the magnetic field in the open area A can be adjusted little by little to get the perfect field. Surely, the width of the first end face 124 can be equal to that of the second end face 126. According to the optimized design, the width of the first end face 124 is larger than that of the second end face 126. Preferably, the relationship between the first end face 124 and the second end face 126 satisfies the following equation:

$$\frac{W}{W+H} = 0.618$$

wherein W is representative of the width of the first end face 124 and H is representative of the width of the second end face 126.

Figure 6:
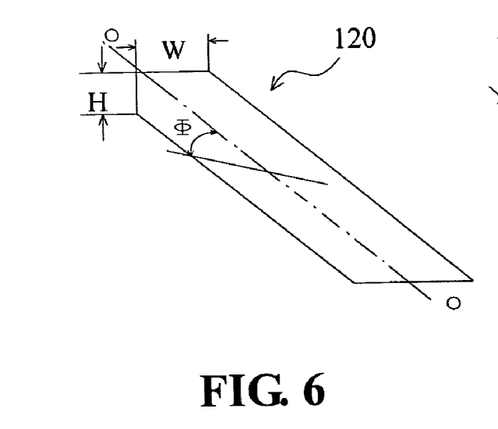
FIG. 6 is a schematic view of the end of the members of permanent magnet shown in FIG. 5, illustrating the magnetization directions of the members.
Figure 7:
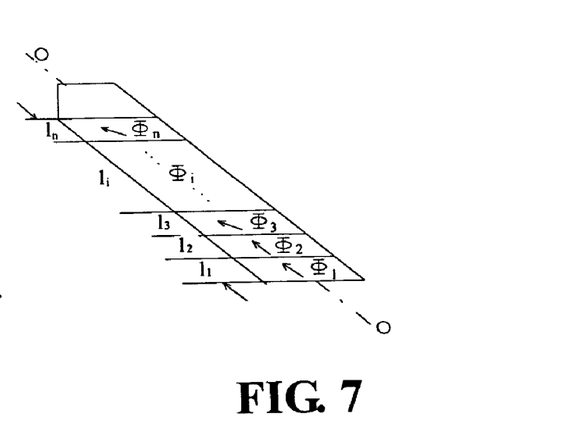
FIG. 7 is a schematic view of the members of permanent magnet shown in FIG. 5 which are magnetized by dividing into subsections.

FIG. 6 is a schematic view of the end of the members of the permanent magnet of the present invention. In fact, the magnetization directions of each member of the permanent magnet have significant relations with the magnetic field in the open area A. To form a uniform field, according to the optimized design in the present invention, the angle between the magnetization direction and the axial of each member of the permanent magnet is about −20°~20°. Furthermore, according to the present invention, each member of permanent magnet is divided into several subsections, each of which is individually magnetized. As shown in FIG. 7, from $I_1$ to $I_n$, the angle $\Phi_i$ between a magnetization direction and an axial of the first/second member of the permanent magnet for each subsection increases from the fixed end to the free end.

In the present invention, the distance between the free ends 122/122' of the first and second member of permanent magnet is about 400 mm, which is very convenient for interventional therapy. Meanwhile, the distance between the free end 122 and the adjusting block 130 is about 200 mm, which is convenient for placement of the imaging sample.

Figure 8:
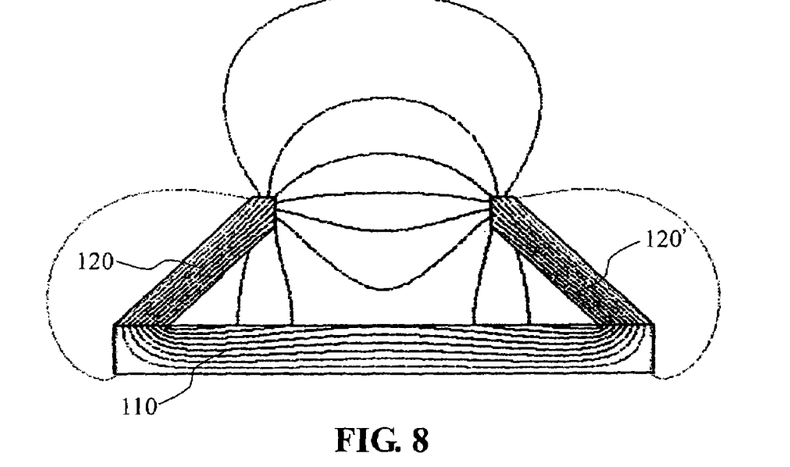
FIG. 8 is a schematic view of the distribution for magnetic lines of force of the magnetic field produced by the members of permanent magnet matched with the field yoke.
Figure 9:
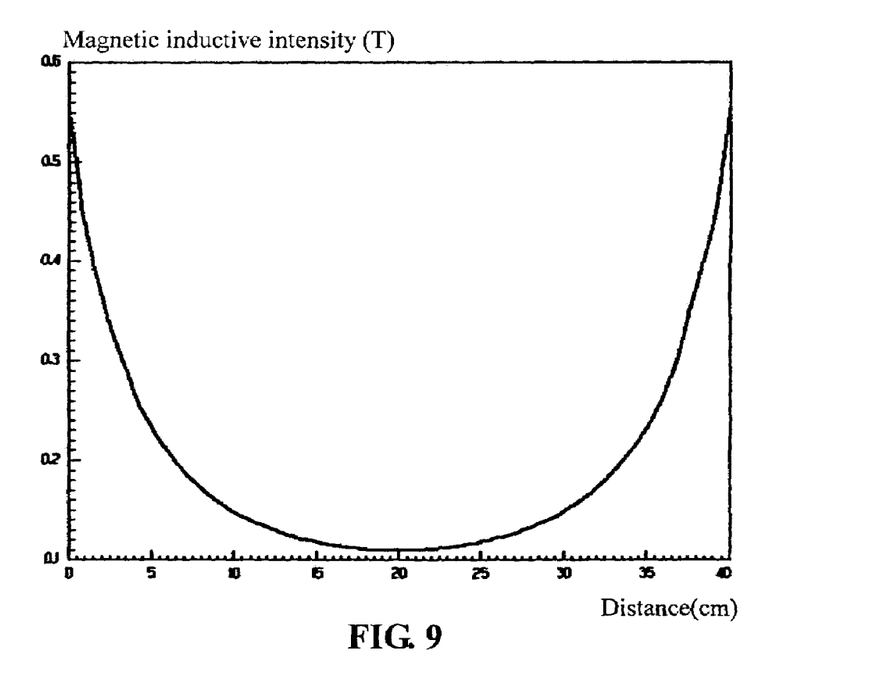
FIG. 9 is a schematic view of the distribution for magnetic inductive intensity in the open area between the free ends of the members of permanent magnet shown in FIG. 8.

After removing the adjusting block, the distribution of the magnetic lines of force in the magnetic field produced by the members of permanent magnet matched with the field yoke is shown in FIG. 8. In the open area between the free ends 122/122' of the first and second members of permanent magnet, the magnetic lines of force of the second end face are becoming uniform but not perfect. Seen from the graph of magnetic inductive intensity as a function of distance shown in FIG. 9, the area of the uniform magnetic field is too small to meet the requirement.

Figure 4B:
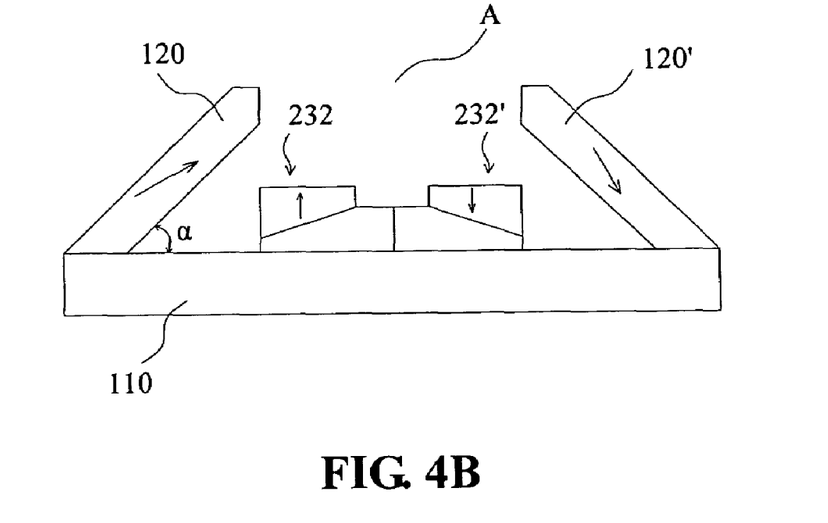
FIG. 4B is a schematic view of the magnet according to another preferred embodiment of the present invention.
Figure 10:
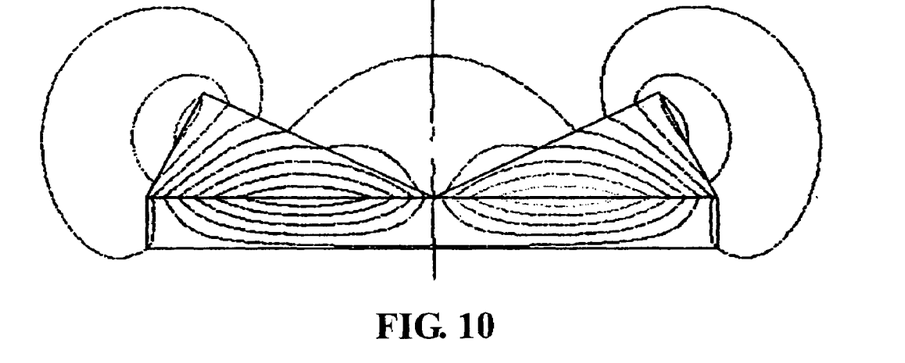
FIG. 10 is a schematic view of the distribution for magnetic lines of force in the magnetic field produced by the adjusting slab.
Figure 11A:
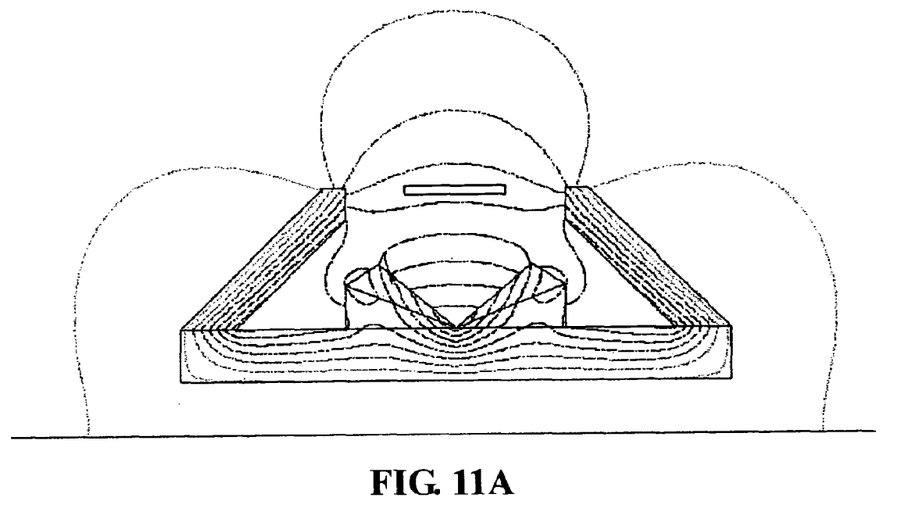
FIG. 11A is a schematic view of the distribution for magnetic lines of force of the preferred embodiment of the present invention above shown in FIG. 4A.
Figure 11B:
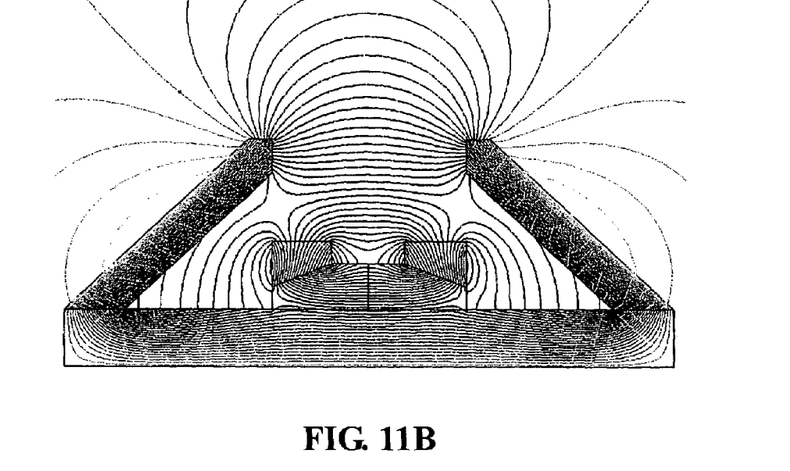
FIG. 11B is a schematic view of the distribution for magnetic lines of force of the preferred embodiment of the present invention above shown in FIG. 4B.

FIG. 10 is a schematic view of the distribution of magnetic lines of force in the magnetic field produced by the adjusting block. As the adjusting block in the present invention is of double layers and a flux loop can be formed between the first and second slabs of the permanent magnet and the magnetic conductors, a regular magnetic field can be produced outside the adjusting block, i.e. between the parts of the adjusting block and in the area near the outer of adjusting block. The action of repelling between the magnetic field above and that in the open area A can extrude the latter, and further, a uniform magnetic field shown in FIG. 11A is obtained. Similarly, the curves shown in FIG. 11B are representative of the distribution of magnetic lines of force in the magnetic field produced by the preferred embodiment shown in FIG. 4B, illustrating the uniform field between the free ends.

Figure 12:
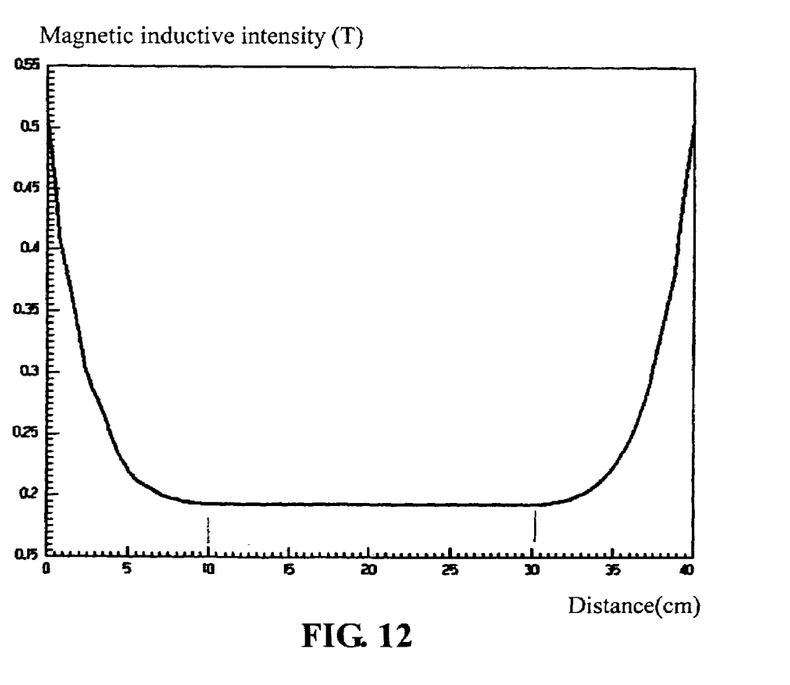
FIG. 12 is a schematic view of the distribution for magnetic inductive intensity in the open area between the free ends of the members of permanent magnet by adding the adjusting block in the present invention.

The graph of magnetic inductive intensity as a function of distance obtained from the embodiment of FIG. 11A is shown in FIG. 12. This shows a uniform magnetic field with proper width can be obtained by adding the adjusting block in the present invention. According to the present invention, the thickness of the uniform magnetic field is about 3 mm.

What is claimed is:

1. A magnet for a magnetic resonance imaging system comprising:
    a field yoke for forming flux loop;
    a first member of permanent magnet, provided on one end of the field yoke, a free end of which is inclined inwardly;
    a second member of permanent magnet, provided on the other end of the field yoke in symmetry with the first member of permanent magnet, having reverse polarity with the first member of permanent magnet in order to generate a magnetic field in association with the first member of permanent magnet, a free end of which is inclined inwardly, wherein an open area for accommodating a sample is formed between the free ends of the first member of permanent magnet and the second member of permanent magnet; and
    an adjusting block, provided on the center of the field yoke for forming magnetic flux to extrude the magnetic field formed by the first member of permanent magnet and the second member of permanent magnet in the open area;
    wherein the adjusting block is divided into two parts symmetrically provided relative to the centerline of the field yoke under the open area, each of which has identical polarity with the first/second member of permanent magnet to be adjacent;
    wherein each part of the adjusting block comprises:
    a slab of permanent magnet for generating the magnetic flux for deforming the magnetic field generated by the first member of permanent magnet and the second member of permanent magnet; and
    a magnetic conductor, provided on the field yoke for supporting the slab of permanent magnet and for assisting the magnetic flux generated by the slab of permanent magnet to form a flux loop.

2. The magnet according to claim 1, wherein the slab of permanent magnet is wedge shaped.

3. The magnet according to claim 1, wherein the slab of permanent magnet is cuboids.

4. The magnet according to claim 1, wherein the free end of each member of permanent magnet comprises:
    a first end face; and
    a second end face perpendicular to the first end face.

5. The magnet according to claim 4, wherein the width of the first end face is larger than that of the second end face.

6. The magnet according to claim 5, wherein the relationship between the widths of the first end face and second end face is $$\frac{W}{W+H} = 0.618,$$

wherein W is representative of the width of the first end face and H is representative of the width of the second end face.

7. The magnet according to claim 4, wherein an angle between the first/second member of permanent magnet and the field yoke is about 25°~55°.

8. The magnet according to claim 7, wherein the angle is preferably about 44°.

9. The magnet according to claim 4, wherein each member of permanent magnet comprises:
    a base; and
    side parts, coupled to the base respectively, the maximum magnetic energy level of which is larger than that of the base.

10. The magnet according to claim 9, wherein the length of the base is about 2~6 times of that of the side part.

11. The magnet according to claim 10, wherein the distance between the free ends of the first and second members of permanent magnet is about 400 mm.

12. The magnet according to claim 11, wherein the distance between the free end and the adjusting block is about 200 mm.

13. A method for forming a uniform magnetic field in a magnetic resonance imaging system, comprising:
    forming a field yoke for forming a flux loop;
    forming a first member of permanent magnet, provided on one end of the field yoke, a free end of which is inclined inwardly;
    forming a second member of permanent magnet, provided on the other end of the field yoke in symmetry with the first member of permanent magnet, having reverse polarity with the first member of permanent magnet in order to generate a magnetic field in association with the first member of permanent magnet, a free end of which is inclined inwardly, wherein an open area for accommodating a sample is formed between the free ends of the first member of permanent magnet and the second member of permanent magnet;
    forming an adjusting block, provided on the center of the field yoke for forming magnetic flux to extrude the magnetic field formed by the first member of permanent magnet and the second member of permanent magnet in the open area;
    dividing the adjusting block into two parts symmetrically provided relative to the centerline of the field yoke under the open area;
    forming a slab of permanent magnet for each part for generating the magnetic flux to deform the magnetic field generated by the first member of permanent magnet and the second member of permanent magnet, having identical polarity with the first/second member of permanent magnet to be adjacent; and
    forming a magnetic conductor for each part, provided on the field yoke for supporting the slab of permanent magnet and for assisting the magnetic flux generated by the slab of permanent magnet to form a flux loop.

14. The method according to claim 13, wherein steps of forming each member of permanent magnet comprise:

forming a first end face at the free end of each member of permanent magnet; and forming a second end face perpendicular to the first end face at the free end of each member of permanent magnet.

15. The method according to claim 14, wherein the angle between the first/second member of permanent magnet and the field yoke is about 25°~55°.

16. The method according to claim 13, wherein the steps of forming each member of permanent magnet comprise:

forming a base; and forming side parts, coupled to the base respectively, the maximum magnetic energy level of which is larger than that of the base.

17. The method according to claim 16, wherein the length of the base is 2~6 times of that of the side parts.

18. The method according to claim 17, wherein the distance between the free ends of the first member of permanent magnet and the second member of permanent magnet is about 400 mm and the distance between the free end and the adjusting block is about 200 mm.

19. The magnet according to claim 7, wherein each member of permanent magnet is divided into several subsections, each of which is individually magnetized.

20. The magnet according to claim 19, wherein an angle between a magnetization direction for each subsection and an axis of each member of permanent magnet is of increment in turn from the fixed end to the free end.

21. The magnet according to claim 20, wherein the angle between the magnetization direction of each subsection and the axis of each member of permanent magnet is about −20°~20°.

22. The method according to claim 15 wherein the method further comprises:

dividing each member of permanent magnet into several subsections; and individually magnetizing each subsection, wherein an angle between a magnetization direction of each subsection and an axis of each member of permanent magnet is of increment in turn from the fixed end to the free end.

23. The method according to claim 22, wherein the angle between the magnetization direction of each subsection and the axis of each member of permanent magnet is about −20°~20°.

* * * * *